United States Patent [19]
Lowery

[11] Patent Number: 5,959,316
[45] Date of Patent: Sep. 28, 1999

[54] MULTIPLE ENCAPSULATION OF PHOSPHOR-LED DEVICES

[75] Inventor: Christopher Haydn Lowery, Fremont, Calif.

[73] Assignee: Hewlett-Packard Company, Palo Alto, Calif.

[21] Appl. No.: 09/144,744

[22] Filed: Sep. 1, 1998

[51] Int. Cl.$^6$ ............................................. H01L 33/00
[52] U.S. Cl. ................... 257/98; 257/99; 257/100; 257/788; 257/789; 257/790; 257/793
[58] Field of Search ..................... 257/100, 99, 788, 257/790, 789, 793, 98

[56] References Cited

U.S. PATENT DOCUMENTS

| | | | |
|---|---|---|---|
| 3,787,684 | 1/1974 | Isenberg | 250/71 R |
| 5,379,186 | 1/1995 | Gold et al. | 361/706 |
| 5,561,329 | 10/1996 | Mine et al. | 257/788 |
| 5,593,721 | 1/1997 | Daidai et al. | 427/100 |
| 5,813,753 | 9/1998 | Vriens | 362/293 |

FOREIGN PATENT DOCUMENTS 7-99345  4/1995  Japan ............................. H01L 33/00

*Primary Examiner*—William Mintel

[57] ABSTRACT

A semiconductor device has a light-emitting diode covered by a transparent spacer which separates the LED from a uniformly thick fluorescent material containing layer such that there is a more uniform lighting of the fluorescent material containing layer to provide a uniform white light.

20 Claims, 1 Drawing Sheet

5,959,316

MULTIPLE ENCAPSULATION OF PHOSPHOR-LED DEVICES

TECHNICAL FIELD

The present invention relates generally to light-emitting diodes and more particularly to light-emitting diodes using fluorescent materials.

BACKGROUND ART

Currently, a blue light-emitting diode, or LED, is used in combination with a fluorescent material to create an LED device to give off white light. White light generally ranges uniformly from 400 to 600 nanometers (nm) in wavelength, but light which appears as a combination of red, blue, and green will also appear as white. By using indium gallium nitride in the LED, it is possible to produce an intense blue light. The blue light passes through a material which contains phosphors which fluoresce in red and green. The combination of blue, red, and green produces an intense light which appears white. Essentially, most of the blue light at 470 nm strikes the phosphors in the fluorescent material, and that light would be up-shifted such that the secondary green and red lights complement the residual blue light which escapes past the phosphors. This provides a final combination of light which appears as white to the human eye.

Unfortunately, it has been determined that the conventional approach of using a fluorescent material layered onto the blue LED produces an LED with a bright, white core surrounded by an annular ring of yellow followed by an annular ring of blue, followed by a final annular ring of yellow. These annular rings do not always occur in a predictable manner from LED to LED, so some LED's provide relatively uniform white light while others have variations of the annular rings.

It has been difficult to determine the cause of these rings and thus, difficult to determine how to solve this problem. Customers view the deviations from white as a defect in the LED.

The above problem occurs both in LED lamps as well as surface-mounted LED lights.

DISCLOSURE OF THE INVENTION

A semiconductor light has a light-emitting diode covered by a transparent spacer. The transparent spacer separates the LED from the fluorescent material such that there is a more uniform lighting of the fluorescent material to provide a constant, uniform white light LED. This eliminates a former problem with white semiconductor lights which emit yellow and/or blue lights.

The advantages of the present invention will become apparent to those skilled in the art from a reading of the following detailed description when taken in conjunction with the accompanying drawings.

BEST MODE FOR CARRYING OUT THE INVENTION

Figure 1:
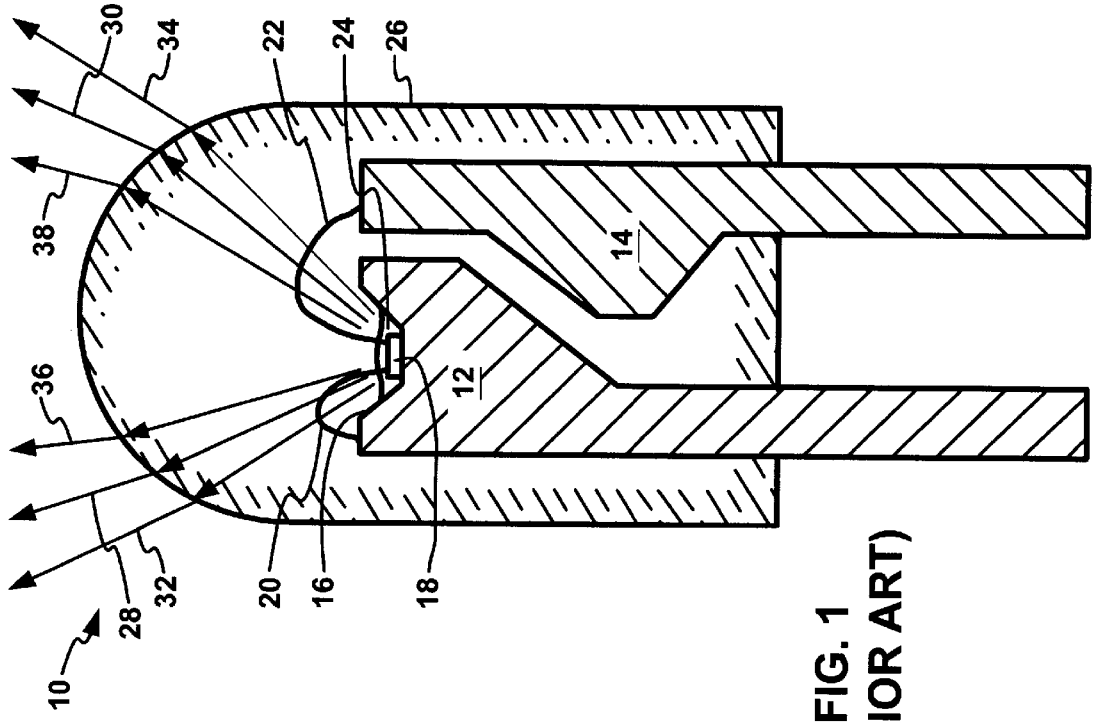
FIG. 1 (PRIOR ART) is a cross-section of a prior LED lamp.

Referring now to FIG. 1 (PRIOR ART), therein is shown a light-emitting diode (LED) lamp 10. The LED lamp 10 has first and second terminals, or lead frames 12 and 14, by which electrical power is supplied to the LED lamp 10. The lead frame 12 has a recessed reflector area 16 in which is disposed an LED 18. The LED is made from an indium-doped gallium nitride epitaxial layer on a transparent sapphire substrate. When activated by a DC current at the appropriate forward voltage, the top surface of the LED of indium gallium nitride produces a blue light at approximately 470 nm wavelength.

The LED 18 is connected by a wire bond 20 to the lead frame 12 and by a wire bond 22 to the lead frame 14. The LED 18 has a layer of fluorescent material 24 disposed over it. The fluorescent material 24 is generally a transparent epoxy resin containing particles of YAG/Gd:Ce phosphor. The entire assembly is embedded in a transparent encapsulation epoxy resin 26.

Also shown in FIG. 1 (PRIOR ART) are arrows 28 and 30, which represent the light rays of an annular blue ring. The arrows 32 and 34 represent the light rays of an outer annular ring, and the arrows 36 and 38 represent an inner annular yellow ring.

Figure 2:
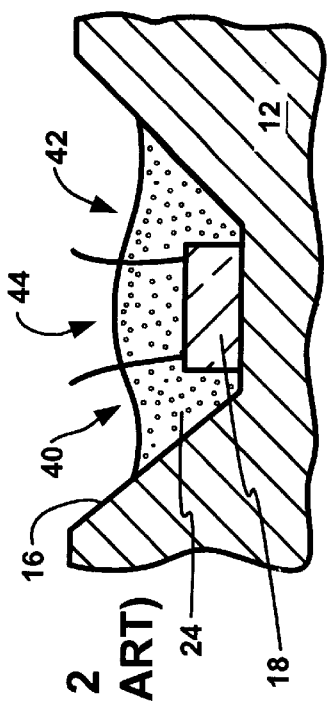
FIG. 2 (PRIOR ART) is a close-up of a prior art LED and its encapsulation system.

Referring now to FIG. 2 (PRIOR ART), therein is shown the lead frame 12 with its reflector portion 16 which forms a cup holding the LED 18. Shown closer up is the layer of fluorescent material 24 having thin areas at 40 and 42 and a thicker area at 44. The final encapsulation epoxy resin 26 is not shown for purposes of simplicity.

Figure 3:
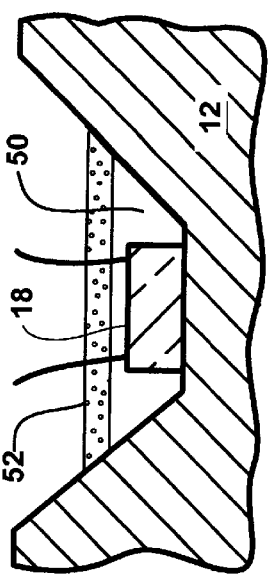
FIG. 3 is a close-up of the LED with the encapsulation system of the present invention.

Referring now to FIG. 3, therein is shown a lead frame 12 with the reflector 16 which holds the LED 18. Similar parts to the prior art are shown with the same number. A transparent spacer 50 is shown encapsulating the LED 18, and a level of fluorescent material 52 is shown disposed above the transparent spacer 50. The final encapsulation epoxy resin 26 is not shown for purposes of simplicity.

Figure 4:
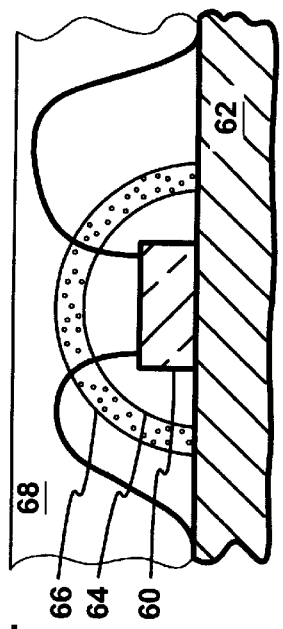
FIG. 4 is a close-up of the LED in a surface-mount device using the encapsulation system of the present invention.

Referring now to FIG. 4, therein is shown a surface-mounted LED light 60 disposed on a device substrate 62 of a surface mount device. The LED 60 is encapsulated in a transparent spacer 64 which is further covered by a layer of fluorescent material 66 and a final transparent encapsulation layer 68.

In operation, the LED lamp 10 of FIG. 1 (PRIOR ART) would have power applied to the lead frame 12 or 14, depending on which part of the LED was the p-junction and which part was the n-junction. Upon the application of power, the top of the LED 18 would emit intense blue light. Where the proper thickness of fluorescent material was provided at area 44, the proper combination of blue light at about 470 nm and the green and red phosphor light at 500 nm and 550 nm, respectively, would produce white light.

Where the layer of fluorescent material was relatively thin at areas 40 and 42, shown in FIG. 2 (PRIOR ART), the blue light would generally provide a blue annular ring along the light ray lines 28 and 30 since there would be insufficient contribution of light from the phosphors. Inside and out of the annular blue ring would be yellow annular rings due to light rays 32 and 34 and light rays 36 and 38 where the phosphors would contribute some light but not enough to create a uniform white light.

It has been determined that the surface tension of the material 24 over the LED 18 causes areas of various thickness which range from the thicknesses at areas 40 and 42 by the corners of the LED 18 and the thickness at area 44 above the center of the LED. This causes nonuniform reradiation of the blue light and causes the annular rings previously described. This appears to be inherent where the layer of fluorescent material 24 is deposited over and around the LED 18.

In the present invention as shown in FIG. 3, it has been determined that the deposition of a transparent spacer 50 over and around the LED 18 and separating a substantially uniform thickness layer of fluorescent material 52 from the LED 18 will eliminate the annular rings. It has also been determined that the transparent spacer 50 can be exactly level with the top of the LED 18, such that the layer of fluorescent material 52 is of a uniform thickness above the LED, and this will also eliminate the problem. However, this latter approach requires more careful volume distribution of the transparent spacer 50 in the cup formed by the conical reflector area 16.

For a surface-mounted LED light as shown in FIG. 4, it is possible to utilize surface tension (which at the size of an LED 18 is large relative to gravitational forces) in combination with viscosity to allow the drop of a hemispherical measure of a viscous, transparent ultraviolet (UV) light-cured resin over the LED 18 which forms the transparent spacer 60. The resin would cover all the corners and then be cured using UV light. This would then be followed with the layer of the fluorescent material 66, also a viscous UV cured resin. The deposition of the transparent spacer 64 would provide a hemisphere as a droplet and then the layer of fluorescent material 66 would flow to conform to the hemispherical shape of the transparent spacer 64 and would be cured prior to the final encapsulation 68 and cure. Since the layer of fluorescent material 66 would be of uniform thickness, it would not be subject to the annular ring problem.

It is necessary to do a fast cure, such as a UV cure, because the normal drop in viscosity during the thermal cure would allow most resins, normally epoxy, to flow away from the LED 18 despite the small size. The final encapsulation layer 68 can then be deposited.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor device comprising:
    a light-emitting semiconductor;
    a transparent encapsulant disposed around said light-emitting semiconductor;
    a fluorescent material containing layer disposed over said light-emitting semiconductor and said transparent encapsulant; and
    input terminals connected to said light-emitting semiconductor for energizing said light-emitting semiconductor to emit light.

2. The semiconductor device as claimed in claim 1 wherein said transparent encapsulant is disposed over said light-emitting semiconductor and said fluorescent material containing layer is spaced from said light-emitting semiconductor by said transparent encapsulant.

3. The semiconductor device as claimed in claim 1 including a protective layer disposed over said fluorescent material containing layer.

4. The semiconductor device as claimed in claim 1 wherein one of said input terminals forms a reflector for said light-emitting semiconductor.

5. The semiconductor device as claimed in claim 1 wherein said light-emitting semiconductor produces light at predetermined wavelengths which is partially converted by said fluorescent material containing layer into another wavelength.

6. The semiconductor device as claimed in claim 1 wherein:
    said light emitting semiconductor produces blue light;
    said fluorescent material containing layer contains phosphors responsive to most of said blue light to produce light combinable with the remainder of said blue light to produce white light therefrom.

7. A semiconductor device comprising:
    a light-emitting diode;
    a transparent encapsulating resin disposed around said light-emitting diode;
    a resin containing fluorescent material disposed over said light-emitting diode and said transparent encapsulating resin; and
    input terminals connected to said light-emitting diode to energize said light-emitting diode to emit light.

8. The semiconductor device as claimed in claim 7 wherein said transparent encapsulating resin is disposed over said light-emitting diode, said resin containing said fluorescent material is spaced from said light-emitting diode by said transparent encapsulating resin, and said resin containing said fluorescent material is of a substantially uniform thickness.

9. The semiconductor device as claimed in claim 7 including a protective resin layer disposed over said resin containing said fluorescent material.

10. The semiconductor device as claimed in claim 7 wherein one of said input terminals forms a reflector for said light-emitting diode and a cup for said resins.

11. The semiconductor device as claimed in claim 7 including a device substrate having said light-emitting diode disposed thereon and said resin dropped thereon.

12. The semiconductor device as claimed in claim 7 wherein said light-emitting diode produces light at predetermined wavelengths which is partially converted by said fluorescent material into another wavelength to provide a uniform white light.

13. The semiconductor device as claimed in claim 7 wherein:
    said light-emitting diode produces blue light;
    said fluorescent material contains a first phosphor responsive to said blue light to produce green light and a second phosphor responsive to said blue light to produce red light; and
    said fluorescent material produces white-appearing light from said blue light passing therethrough and said red, and said green light emitted therefrom.

14. A semiconductor device comprising:
    a sapphire substrate;
    an indium-doped gallium nitride epitaxial layer disposed upon said sapphire substrate to form a light-emitting diode;
    a transparent encapsulating resin disposed around said sapphire substrate;
    a YAG/Gd:Ce phosphor containing resin disposed over said epitaxial layer and said transparent encapsulating resin; and input terminals connected to said epitaxial layer for energizing said epitaxial layer to emit light.

15. The semiconductor device as claimed in claim 14 wherein said transparent encapsulating resin is disposed over said epitaxial layer and said phosphor containing resin is spaced from said epitaxial layer by said transparent encapsulating resin.

16. The semiconductor device as claimed in claim 14 including a protective layer disposed over said phosphor containing resin.

17. The semiconductor device as claimed in claim 14 wherein one of said input terminals forms a reflector for said epitaxial layer on said sapphire substrate.

18. The semiconductor device as claimed in claim 14 including a device substrate having said sapphire substrate disposed thereon.

19. The semiconductor device as claimed in claim 14 wherein said epitaxial layer produces light at predetermined wavelengths which is partially converted by said phosphor containing resin into another wavelength to provide uniform white-appearing light.

20. The semiconductor device as claimed in claim 14 wherein:
   said epitaxial layer produces blue light;
   said YAG/Gd:Ce phosphor-containing resin emits green and red light in response to most of said blue light; and
   said YAG/Gd:Ce phosphor-containing resin produces white appearing light from said green and red light emitted therefrom and said residual blue light passing therethrough.

* * * * *